United States Patent
Pöchmüller

(10) Patent No.: US 6,310,812 B1
(45) Date of Patent: Oct. 30, 2001

(54) INTEGRATED MEMORY HAVING MEMORY CELLS AND REFERENCE CELLS

(75) Inventor: Peter Pöchmüller, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/662,256

(22) Filed: Sep. 14, 2000

(30) Foreign Application Priority Data

Sep. 14, 1999 (DE) .............................. 199 44 037

(51) Int. Cl.[7] .................................................. G11C 29/00
(52) U.S. Cl. ........................ 365/210; 365/145; 365/201
(58) Field of Search ............................. 365/201, 210, 365/145

(56) References Cited

U.S. PATENT DOCUMENTS

| | | | |
|---|---|---|---|
| 5,023,839 | 6/1991 | Suzuki et al. | 365/200 |
| 5,265,056 * | 11/1993 | Butler et al. | 365/201 |
| 5,844,832 | 12/1998 | Kim | 365/145 |
| 6,055,200 * | 4/2000 | Choi et al. | 365/201 |
| 6,067,263 * | 5/2000 | Brady | 365/201 |

* cited by examiner

Primary Examiner—Tan T. Nguyen
(74) Attorney, Agent, or Firm—Herbert L. Lerner; Laurence A. Greenberg; Werner H. Stemer

(57) ABSTRACT

Memory cells are arranged at crossover points of word lines WLi and bit lines. First reference cells are arranged at crossover points of at least one first reference word line and bit lines. In a normal operating mode, the reference cells serve for generating a reference potential on the bit lines prior to a readout of the memory cells. Second reference cells are arranged at crossover points of at least one second reference word line and the bit lines. In a test operating mode, the second reference cells serve for generating a reference potential on the bit lines prior to a readout of the reference cells.

4 Claims, 1 Drawing Sheet

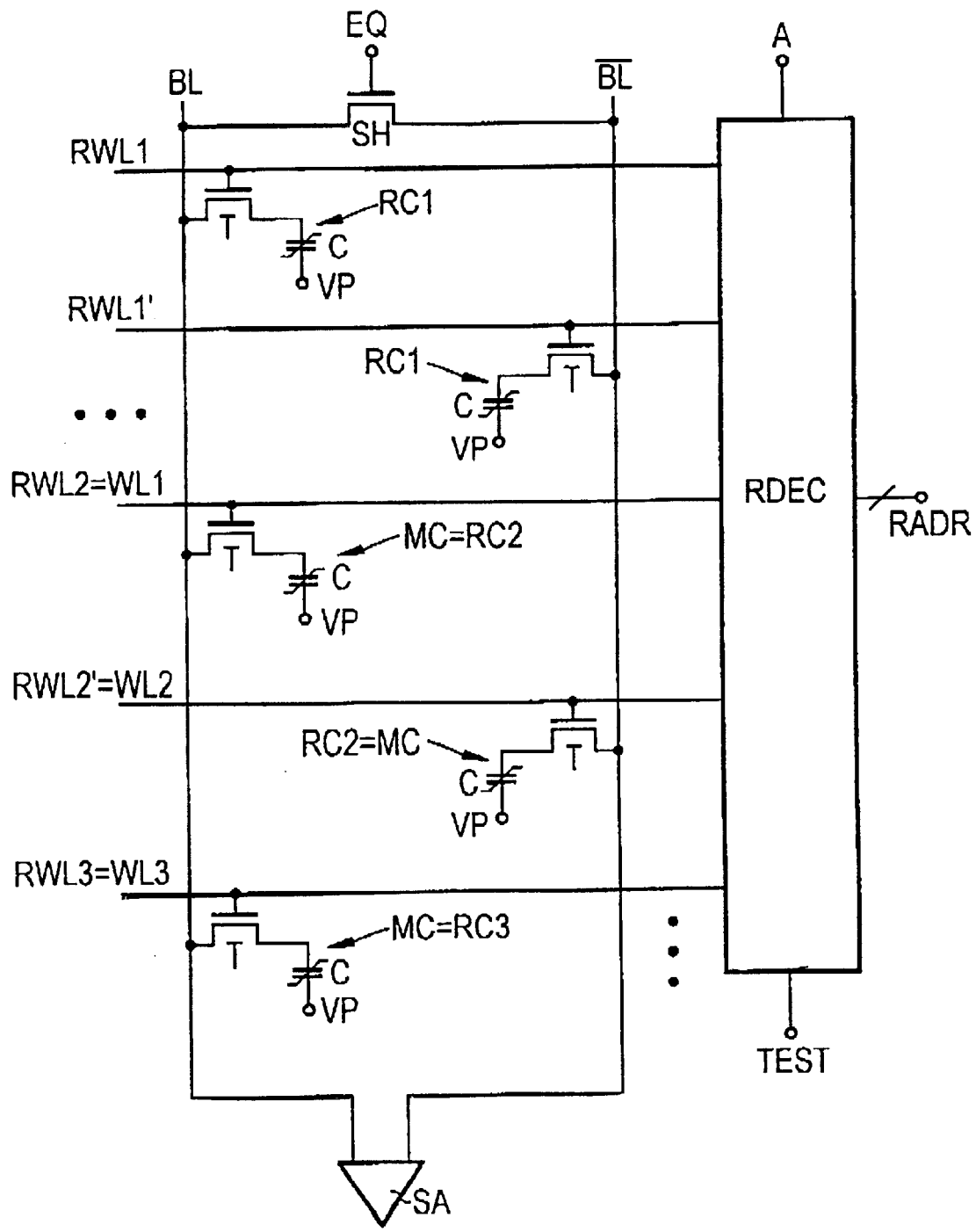

INTEGRATED MEMORY HAVING MEMORY CELLS AND REFERENCE CELLS

BACKGROUND OF THE INVENTION

Field of the Invention

The invention lies in the integrated technology field. More specifically, the invention relates to an integrated memory having memory cells, arranged at crossover points of word lines and bit lines, and reference cells, arranged at crossover points of a reference word line and the bit lines and serve for generating a reference potential on the bit lines prior to a readout of the memory cells.

Such an integrated memory in the form of a ferroelectric memory or FRAM (Ferroelectric Random Access Memory) is described in U.S. Pat. No. 5,844,832. Prior to a read access to the memory cells, a specific potential is written to the reference cells and the latter are subsequently read out onto the bit lines. Afterwards, in each case two adjacent bit lines onto which reference cells having different levels were read out are short-circuited with one another, so that a reference potential corresponding to the average value of the two different levels is established on these two bit lines. The reference cells are thereby constructed identically to the regular memory cells. Prior to each readout of the memory cells, that is to say, for example, also during a test of the memory cells, the reference potential is generated on the bit lines by means of the reference cells in the manner described in order to feed the defined reference potential to sense amplifiers, which are connected to the bit lines, prior to an evaluation of the bit line potentials which is to be carried out by the sense amplifiers.

Errors during the readout of one of the memory cells in the prior art memory can have two different causes. On the one hand, the memory cell that is currently to be read out or the word line connected to it may have a defect. On the other hand, the associated reference cell may have a defect, so that the reference potential is not generated correctly, thereby preventing error-free evaluation of the bit line potential by the sense amplifiers. It is desirable, therefore, to be able to ascertain whether or not an error occurring during the readout of one of the memory cells is caused by a malfunction of the reference cells.

SUMMARY OF THE INVENTION

The object of the invention is to provide an integrated memory with memory cells and reference cells which overcomes the above-noted deficiencies and disadvantages of the prior art devices and methods of this kind, and which allows the testing of the functionality of the reference cells in a simple manner.

With the above and other objects in view there is provided, in accordance with the invention, an integrated memory, comprising:
  word lines and bit lines and a plurality of memory cells arranged at respective crossover points of the word lines and the bit lines;
  first reference cells arranged at crossover points of at least one first reference word line and the bit lines, the first reference cells, in a normal operating mode, generating a reference potential on the bit lines prior to a readout of the memory cells;
  second reference cells arranged at crossover points of at least one second reference word line and the bit lines, the second reference cells, in a test operating mode, generating a reference potential on the bit lines prior to a readout of the first reference cells.

In other words, the novel memory has memory cells, which are arranged at crossover points of word lines and bit lines, and first reference cells, which are arranged at crossover points of at least one first reference word line and the bit lines and, in a normal operating mode, serve for generating a reference potential on the bit lines prior to a readout of the memory cells. In addition, the device has second reference cells, which are arranged at crossover points of at least one second reference word line and the bit lines and, in a test operating mode, serve for generating a reference potential on the bit lines prior to a readout of the first reference cells.

The second reference cells thus enable functional checking of the first reference cells in the test operating mode, in that, with their aid, a corresponding reference potential is generated on the bit lines. Consequently, the first reference cells can be read out in the test operating mode in the same way as this is done with the normal memory cells in the normal operating mode. If a defect in the second reference cells can be ruled out, the conclusion that can be drawn if a functional disturbance occurs during the readout of one of the first reference cells is that there is a defect in the first reference cell. If, by contrast, it is not known whether the second reference cells are intact, and if an error is detected during the readout of one of the first reference cells in the test operating mode, it is certain that either the corresponding first reference cell or the second reference cells used for generating the reference potential has or have a defect.

In accordance with an added feature of the invention, the second reference word line is identical to one of the word lines and the second reference cells are identical to the memory cells connected to the word line. This means that, in the normal operating mode, the first reference cells serve for generating the reference potential prior to a readout of one of the normal memory cells, while in the test operating mode, the normal memory cells of the second reference word line serve for generating the reference potential prior to a readout of one of the first reference cells. In this development, no further cells are necessary in addition to the normal memory cells and first reference cells, so that a memory of this type can be realized with a comparatively small area.

In accordance with an additional feature of the invention, the memory device further comprises:
  address inputs for feeding in row addresses for addressing the word lines;
  a row decoder configured to:
    enable addressing the second reference word line by means of a specific one of the row addresses in the normal operating mode; and
    enable addressing the first reference word line by means of a specific row address in the test operating mode.

This enables the first reference word line to be addressed in the test operating mode in the same way as an arbitrary one of the word lines is addressed in the normal operating mode.

In accordance with a concomitant feature of the invention, the memory device further comprises:
  a plurality of second reference word lines;
  a control input for receiving a control signal, for effecting a selection of at least one of the second reference word lines, and wherein the second reference cells subsequently serve for generating the reference potential on the bit lines in the test operating mode prior to a readout of the first reference cells.

The control signal is used to effect selection of at least one of the second reference word lines, whose second reference cells subsequently serve for generating the reference potential on the bit lines in the test operating mode prior to a readout of the first reference cells. In this development, in the test operating mode one of the first reference cells can be read out multiply, during which the necessary reference potential is generated on the bit lines successively in each case by different second reference cells. It can therefore be ascertained whether the occurrence of a defect during the readout is to be attributed to a malfunction of the corresponding first reference cell or of the second reference cell. Specifically, if the first reference cell is defective, when it is read out an incorrect result will always be produced, irrespective of the second reference cell used in each case. By contrast, it is improbable that a plurality of second reference cells, assigned to different second reference word lines, will be defective simultaneously.

Other features which are considered as characteristic for the invention are set forth in the appended claims.

Although the invention is illustrated and described herein as embodied in an integrated memory having memory cells and reference cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a schematic diagram of an exemplary embodiment of the integrated memory according to the invention.

DESCRIPTION OF THE PREFERRED EMBODIMENT

Referring now to the sole figure of the drawing in detail, there is seen a detail of a memory cell array of an integrated memory of the FRAM type. The figure illustrates a bit line pair BL, /BL connected to a sense amplifier SA. The memory has first reference word lines RWL1, RWL1' and also word lines WLi. A large number of word lines WLi are present, but only three are illustrated in the figure. Normal memory cells MC are situated at points of intersection between the word lines WLi and the bit lines BL, /BL, and first reference cells RC1 are situated at points of intersection between the first reference lines RWL1, RWL1' and the bit lines. The memory cells MC and first reference cells RC1 are constructed identically. Each of them has a storage capacitor C with a ferroelectric dielectric, and a selection transistor T. One of the electrodes of the storage capacitors C is connected to a plate potential VP and the other electrode is connected to the corresponding bit line BL, /BL via the controllable path of the selection transistor T. The gate of the selection transistor T is connected to the corresponding word line WLi or reference word line RWL1, RWL1'.

The two bit lines BL, /BL are connected to one another via a short-circuiting transistor SH. The gate of the short-circuiting transistor SH is connected to a short-circuit signal EQ. Furthermore, the memory has a row decoder RDEC, to which can be fed row addresses RADR, which can be used to address the word lines WLi in a normal operating mode of the memory. An operating mode signal TEST is fed to the row decoder RDEC and indicates whether the memory is in the normal operating mode or in a test operating mode. Moreover, a control signal A is fed to the row decoder RDEC.

The method of operation of the circuit illustrated in the figure in the event of a read access to one of the memory cells MC is as follows: prior to the read access, firstly a logic 0 is stored in one of the two first reference cells RC1 and a logic 1 in the other reference cell. Afterwards, the two bit lines BL, /BL are discharged and the two first reference cells are thereupon read out onto the bit lines. In this case, firstly the short-circuiting transistor SH is turned off and the sense amplifier SA is inactive. The short-circuiting transistor SH is then switched on, so that charge balancing takes place between the two bit lines. A reference potential is established on both bit lines BL, /BL during this process.

The reference potential corresponds approximately to the average value of the two potentials previously established on the bit lines. The short-circuiting transistor SH is then turned off. It is only then, by activation of one of the word lines WLi, that one of the memory cells MC is selected in dependence on the row address RADR fed to the row decoder RDEC. By way of example, the word line WL1 is activated, so that the content of the memory cell MC connected to it is read out onto the left-hand bit line BL. The sense amplifier SA is then activated. The sense amplifier amplifies the potential difference between the two bit lines. In this case, the potential of the left-hand bit line BL is evaluated relative to the reference potential still present on the right-hand bit line /BL.

The functionality of the first reference cells RC1 is checked in the test operating mode. This is done by writing a datum to the first reference cells and subsequently reading it out again. Since the sense amplifier SA requires the reference potential in this case too, for correct evaluation, said reference potential is generated by means of two of the normal memory cells MC in the test operating mode. In this exemplary embodiment, the first word line WL1 and the second word line WL2 are second reference word lines RWL2, RWL2' and the memory cells MC connected to them are second reference cells RC2. The second reference cells RC2 serve for generating the reference potential on the bit lines BL, /BL in the test operating mode, like the first reference cells RC1 in the normal operating mode. Therefore, in the test operating mode, prior to an access to one of the first reference cells RC1, a first logic level is written to the second reference cell RC2 connected to the first word line WL1, and a second logic level is written to the second reference cell RC2 connected to the second word line WL2. After the bit lines have been discharged, the two items of information are read out and subsequent short-circuiting is effected by means of the short-circuiting transistor SH, as a result of which the reference potential is generated. Afterwards, by the activation of one of the two first reference word lines RWL1, RWL1', a previously written datum can be read out from one of the two first reference cells RC1. The sense amplifier SA is thereupon activated and performs evaluation of the potential difference on the bit line pair BL, /BL.

The memory of this exemplary embodiment has even further pairs of second reference word lines which are likewise formed by two of the normal word lines WLi in each case. Of these, the figure illustrates only a further second reference word line RWL3. It should be noted that the memory has a significantly larger number of normal word lines WLi which, unlike those illustrated in the figure, do not perform a dual function, that is to say are not at the same time two further reference word lines as well. In the test operating mode, an arbitrary one of the pairs of second reference word lines RWL2, RWL2', RWL3 may serve for generating the reference potential on the bit lines BL, /BL prior to a readout of one of the first reference cells RC1. It is also possible for example for the lower second reference word line RWL3 to be used for generating the reference potential instead of the upper second reference word line RWL2, together with the middle reference word line RWL2'. Consequently, the reference potential can be generated correctly in the test operating mode even if the first word line WL1 or the memory cell MC connected to it has a defect. The control signal A is a digital control signal having a width of a plurality of bits. It serves for selecting two of the second reference word lines RWL2, RWL2', RWL3 for generating the reference potential on the bit lines in the test operating mode.

In other exemplary embodiments of the invention, it is also possible for there to be only two second reference word lines RWL2, RWL2'.

If, in the test operating mode, the reference potential is generated by means of the first word line WL1 and the second word line WL2 as second reference word lines RWL2, RWL2', in this exemplary embodiment of the invention the subsequent addressing of the first reference word lines RWL1, RWL1' is effected by means of those row addresses RADR which, in the normal operating mode, are assigned to the first word line WL1 and to the second word line WL2, respectively. This enables the memory to be operated in the test operating mode in the same way as in the normal operating mode, except that in the latter the first reference cells RC1 serve for generating the reference potential during the readout of one of the memory cells MC and in the former the second reference cells RC2 serve for generating the reference potential of an arbitrary other memory cell MC and of the first reference cells RC1.

The memory which is partially illustrated in the figure has bit lines according to the folded bit line concept. It goes without saying that the inventive concept is also applicable to memories having a different bit line architecture, in particular those according to the open bit line concept, as is explained for example in the above-mentioned U.S. Pat. No. 5,844,832.

Although the invention has been explained here by way of example using an FRAM, it can also be applied to other memories in which corresponding reference potentials have to be generated on the bit lines prior to the readout of memory cells.

Although some of the word lines WLi are identical to the second reference word lines RWL2, RWL2', RWL3 in the exemplary embodiment outlined here, it is possible in other exemplary embodiments for the second reference word lines to be present in addition to the normal word lines WLi.

In the exemplary embodiment shown in the figure, the first reference cells RC1 are connected to different first reference word lines RWL1, RWL1'. In addition, the second reference cells RC2 are connected to different second reference word lines RWL2, RWL2'. Other exemplary embodiments are possible in which both first reference cells RC1 are connected to a common first reference word line RWL1 and both second reference cells RC2 are connected to a common second reference word line RWL2.

I claim:

1. An integrated memory, comprising:

word lines and bit lines and a plurality of memory cells arranged at respective crossover points of said word lines and said bit lines;

first reference cells arranged at crossover points of at least one first reference word line and said bit lines, said first reference cells, in a normal operating mode, generating a reference potential on said bit lines prior to a readout of said memory cells;

second reference cells arranged at crossover points of at least one second reference word line and said bit lines, said second reference cells, in a test operating mode, generating a reference potential on said bit lines prior to a readout of said first reference cells.

2. The integrated memory according to claim 1, wherein said second reference word line is identical to one of said word lines and said second reference cells are identical to said memory cells connected to said word line.

3. The integrated memory according to claim 2, which further comprises:

address inputs for feeding in row addresses for addressing said word lines;

a row decoder configured to:
  enable addressing said second reference word line by means of a specific one of the row addresses in the normal operating mode; and
  enable addressing said first reference word line by means of a specific row address in the test operating mode.

4. The integrated memory according to claim 1, which further comprises:

a plurality of second reference word lines;

a control input for receiving a control signal, for effecting a selection of at least one of said second reference word lines, and wherein said second reference cells subsequently serve for generating the reference potential on said bit lines in the test operating mode prior to a readout of said first reference cells.

* * * * *